Feb. 10, 1970 E. C. J. JEZIERSKI ET AL 3,495,187

CRYSTAL CONTROLLED SEMICONDUCTOR OSCILLATOR

Filed April 10, 1968 3 Sheets-Sheet 1

Inventors
EUGENIUSZ C. J. JEZIERSKI
JOHN McLELLAN
By [signature]
Attorney

Inventors
EUGENIUSZ C. J. JEZIERSKI
JOHN McLELLAN
By [signature]
Attorney

Inventors
EUGENIUSZ C. J. JEZIERSKI
JOHN McLELLAN
By [signature]
Attorney

United States Patent Office 3,495,187

Patented Feb. 10, 1970

3,495,187

CRYSTAL CONTROLLED SEMICONDUCTOR OSCILLATOR

Eugeniusz Czeslaw Jan Jezierski, Ilminster, Somerset, and John McLellan, New Barnet, England, assignors to International Standard Electric Corporation, New York, N.Y., a corporation of Delaware Filed Apr. 10, 1968, Ser. No. 720,194
Claims priority, application Great Britain, Apr. 21, 1967, 18,472/67
Int. Cl. H03b 5/30, 5/36
U.S. Cl. 331—116 7 Claims

ABSTRACT OF THE DISCLOSURE

A crystal controlled microminiature oscillator circuit suitable for integrated circuit construction utilizing no inductive components and having two transistors in tandem with a RC feedback circuit. A single crystal, or a selected one of a number of crystals arranged in a switching arrangement, is connected across the input of the first transistor to restrict the oscillations to a harmonic of the crystal's fundamental frequency which is selected by the time constant of the feedback circuit. The frequency may be varied slightly by changing the time constant of the feedback circuit using a transistor to switch a shunting resistor into or out of the circuit (for a coarse adjustment) and/or varying the current through a diode (for a fine adjustment) to continuously vary the effective capacitance in the feedback circuit.

BACKGROUND OF THE INVENTION

This invention relates to semiconductor oscillators which are crystal controlled and which may be adjusted to oscillate at one of several harmonics of the crystal fundamental frequency.

The use of crystals at very high frequencies only becomes practicable if overtone modes of the crystal are exploited, since the frequency range of the highest quality crystals is restricted to the lower frequencies.

Crystal controlled oscillators adjustable to more than one frequency usually employ inductors and/or transformers, but these components are difficult to accommodate in microminiature circuitry without losing the size advantages of such circuitry.

SUMMARY OF THE INVENTION

It is an object of the present invention to provide stable semiconductor oscillator circuits for very high frequencies which do not include inductors or transformers.

It is further an object of the invention to provide a selectable crystal controlled multi-frequency oscillator of high stability.

Accordingly there is provided a crystal controlled semiconductor oscillator whose other electrical components are resistors and capacitors, in which at least two semiconductor devices are connected in tandem, a feedback circuit being connected between two of the semiconductor devices so as to produce an oscillation, and the crystal being such as to restrict the generated oscillation to a selectable harmonic of the fundamental frequency of the crystal.

BRIEF DESCRIPTION OF THE DRAWINGS

The invention will now be described with reference to the accompanying drawings in which.

DESCRIPTION OF THE PREFERRED EMBODIMENTS

Figure 1:
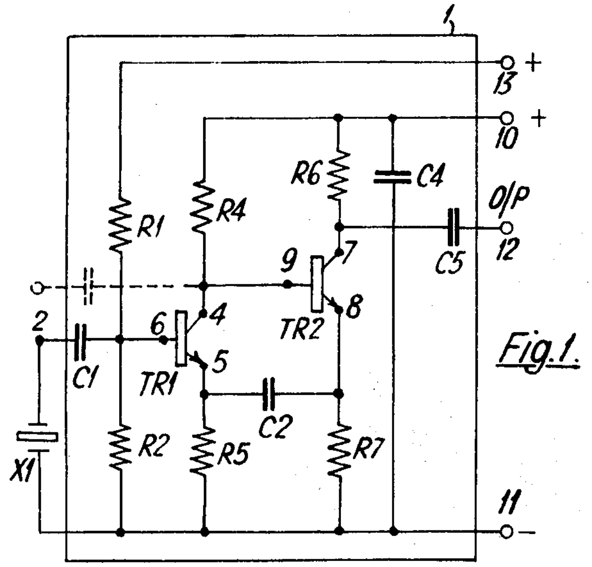
FIG. 1 is a schematic circuit diagram of an embodiment of the invention.

Referring to FIG. 1 the block 1 includes a transistor TR1 the collector 4 of which is connected both to the base 9 of the transistor TR2 and via a resistor R4 to the positive terminal 10 of a power supply. The base 6 is connected both to a capacitor C1 and the junction of resistors R1, R2. The current bias for the base 6 of TR1 is provided by the resistive potentiometer R1–R2 connected between a source of positive potential 13 and a point of zero signal potential 11, to which the negative power supply is also connected. The collector 7 of transistor TR2 is connected both to the positive terminal 10 of the power supply via a resistor R6 and to an output terminal 12 via a capacitor C5. The emitters 5 and 8 of the transistors TR1 and TR2 respectively are connected together via a capacitor C2 and are connected to negative via respective resistors R5 and R7. A capacitor C4 is connected across the power supply at 10 and 11 for decoupling purposes.

The capacitor C2 and resistors R5, R7 form a feedback circuit between the emitter circuits of the two transistors. If the terminal 2 is connected to negative the arrangement becomes a free-running relaxation oscillator.

Assume transistor TR1 is conducting and transistor TR2 is cut off, the charging current of C2 develops a negative voltage across the resistance R7 which increases until the emitter voltage of transistor TR2 is sufficiently high to cause it to conduct. The charging current of C2 then ceases and the emitter current of transistor TR1 starts to fall. This fall causes the collector voltage of transistor TR1, which is also the base voltage of transistor TR2, to rise, which further increases the current flowing through transistor TR2, the process continuing until TR1 is finally cut off.

Transistor TR2 is now fully conducting and transistor TR1 is cut off and a similar action takes place in reverse until transistor TR1 is again conductive and transistor TR2 cut off.

The connection shown between terminals 2 and 11 includes an overtone crystal X1 which at the odd harmonics of its fundamental frequency becomes a series resonant circuit and exhibits a low resistance in contrast to the high impedance it exhibits at all other frequencies. Since this crystal is effectively connected across the input to the transistor TR1, the circuit will only oscillate at one of the harmonic frequencies of the crystal, being that harmonic which is nearest to the frequtncy of the relaxation oscillations.

To select the required harmonic the time constant of the feedback circuit is adjusted preferably by varying the value of the capacitor C2.

The crystal frequency may be "pulled," i.e. the apparent fundamental resonant frequency of the crystal may be varied over a small range, usually a few hundred cycles per second, by varying the bias voltage applied to the transistor TR1. This may be done conveniently by applying a varying voltage to terminal 13. Alternatively, a few kilocycles per second variation may be achieved by adjusting the value of the capacitor C2 (to a lesser degree than for harmonic-mode changing, as above.

A circuit as described with reference to FIG. 1 and having an output in the 70–80 mc. band used an overtone crystal oscillating at the fifth harmonic of its fundamental frequency and employed npn transistors with a collector supply voltage of +4 v. DC. The values of resistance and capacitance tabulated below were also used.

| | | |
|---|---|---|
| R1 | | 1.8KΩ |
| R2 | | 1KΩ |
| R4 | | 220Ω |
| R5 | | 500Ω |
| R6 | | 47Ω |
| R7 | | 330Ω |
| C1 | pf | 330 |
| C2 | pf | 3–30 |
| C4 | pf | 1000 |
| C5 | pf | 1000 |

The modification of the resistance and capacity values to suit other transistors, to select a different harmonic or to produce other relaxation oscillations will be apparent to those skilled in the art, from the description of the operation, the relevant circuit and the particular values indicated above.

Figure 2:
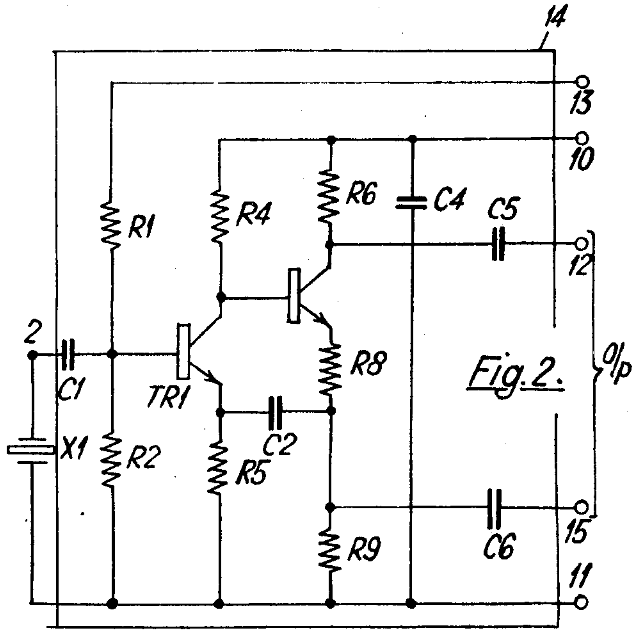
FIG. 2 is a schematic circuit diagram of the embodiment of FIG. 1 provided with a balanced output circuit.

A balanced output from the oscillator may be obtained in the manner shown in FIG. 2.

Referring to FIG. 2 the resistance R7 in the emitter circuit of transistor TR2 is replaced by two resistances R8 and R9, the sum of which is equal to R7, the resistance R8 being small compared to resistance R9. The second output 15 is taken via a capacitor C6 from the junction of R8 and R9.

The output voltage in this case (FIG. 2) is reduced and harmonic distortion is greater, but the range of frequency control over a selected overtone frequency is greater (by virtue of the changed R9–C2 time constant) and hence the range of crystal frequency pulling is greater than that obtained with the embodiment described with reference to FIG. 1.

Figure 3:
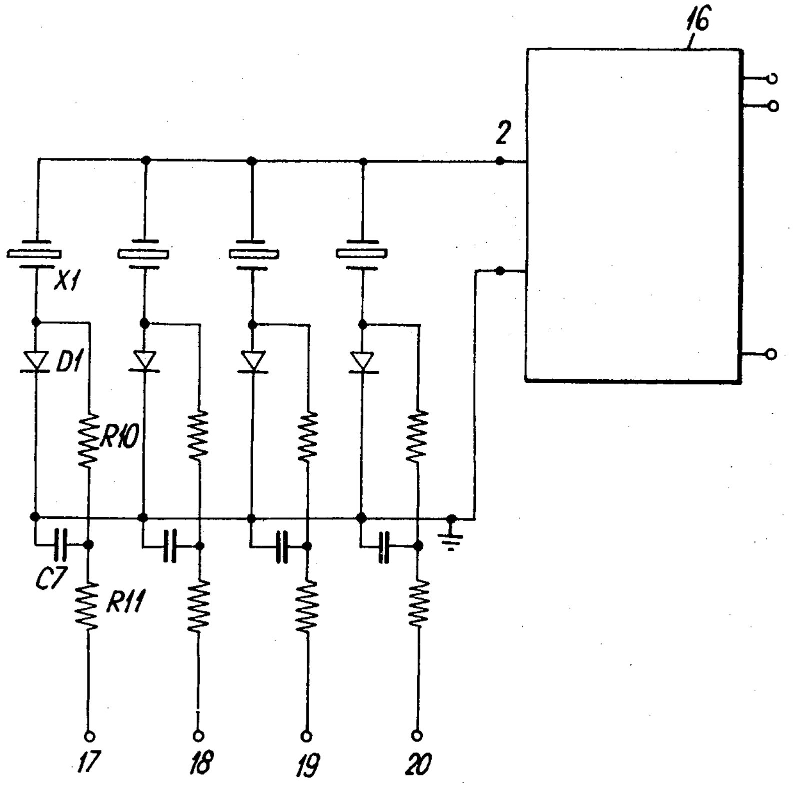
FIG. 3 is a circuit diagram of a variable frequency oscillator based on the embodiment of FIG. 1 or FIG. 2, using a number of crystals.

An application of the invention using a number of crystals switched electronically to produce a multifrequency crystal controlled oscillator is shown in FIG. 3. The block 16 may be identical to either block 1, FIG. 1, or block 14, FIG. 2. The crystals have one terminal connected to terminal 2 of capacitor C1 and the other terminal connected each to a respective switching network. Each switching network includes a semiconductor diode D1 having its anode connected to the crystal and to a resistor R10 which has a value high compared to R2. The other end of resistor R10 is connected to the junction of a resistor R11 and a capacitor C7. A positive D.C. switching voltage is applied by a suitable switch to the terminal 17 connected to the other end of R11; this voltage must be high enough to cause a direct current higher than the peak signal current through the crystal to flow via R11 and R10 through the diode to earth (negative line). When the switching voltage is applied to a switching network, the impedance of the respective diode becomes low and the oscillation of the circuit 16 is controlled by the respective crystal connected to the network.

Consequently the application of the swiching voltage to and one of terminals 17 to 20 causes the associated crystal to control the frequency of the oscillator, the capacitor C17 and R11 being a decoupling network to isolate the switching supply from the oscillator.

In an embodiment in which output frequencies between 70 and 80 mc./s. in 0.5 mc./s. steps were required, 20 crystals were used oscillating at the fifth harmonic. The values used for R10, R11 and C6 were 6.8KΩ, 330Ω and 1000 pf. respectively.

Figure 4:
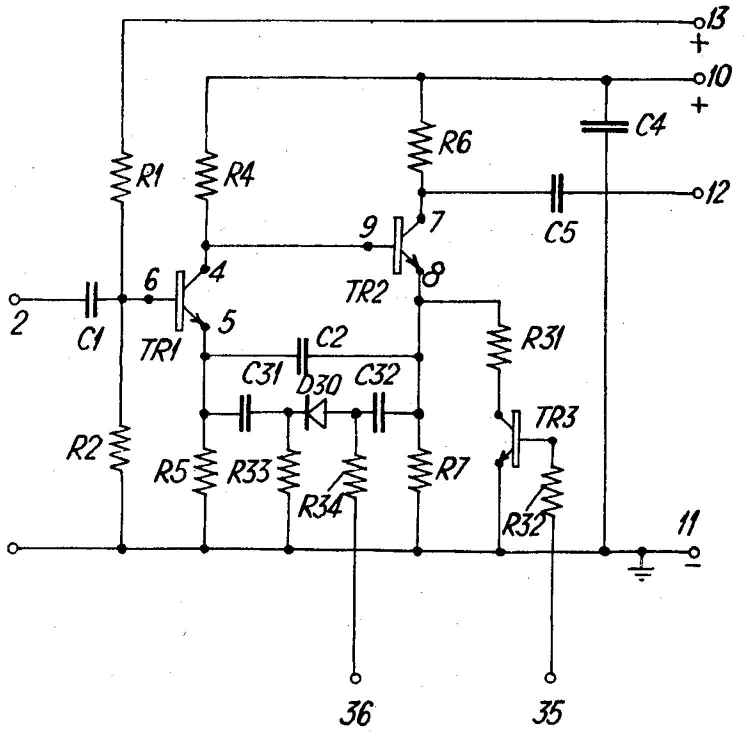
FIG. 4 shows a modification of the invention controllable over a wide frequency range.

Frequency control arrangements suitable for a wide frequency range are shown in FIGURE 4 in which components which have the same function as those in FIGURE 1 have the same numbers.

In this arrangement, the oscillator has a coarse control provided by R31, TR3 and R32, the fine control provided by R33, R34, C31, C32 D30. The application of a positive switching voltage to terminal 35 causes transistor TR3 to become almost zero impedance, thus connecting R31 in parallel with R7 so altering the time constant of the feedback loop.

The application of a positive voltage to terminal 36 causes a current to flow via R34, D30 and R33, and the impedance of the diode D30 varies with the amplitude of the voltage. As the impedance of the diode falls, the effect of C31 and C32, which are in series, in parallel with C2, is increased, and a fine variation of the time constant of the feedback loop results.

It is to be understood that the foregoing description of specific examples of this invention is made by way of example only and is not to be considered as a limitation on its scope.

We claim:

1. A crystal controlled semiconductor oscillator circuit comprising:

a first and second transistor connected in tandem;

a non-inductive feedback circuit coupling the output of the second transistor to the input of the first transistor;

a crystal coupled across the input of said first transistor and restricting the oscillations of said oscillator circuit to a selected harmonic of the fundamental frequency of said crystal;

and means including an RC network in said feedback circuit for selecting said harmonic.

2. A crystal controlled semiconductor oscillator circuit according to claim 1, wherein said feedback circuit comprises:

a first resistor in the collector-emitter circuit of the first transistor;

a second resistor in the collector-emitter circuit of the second transistor;

and a capacitor coupling the aforesaid resistors.

3. A crystal controlled semiconductor oscillator circuit according to claim 1, wherein said feedback circuit comprises:

a first resistor in the collector-emitter circuit of the first transistor, a second and third series connected resistor in the collector-emitter circuit of the second transistor;

a first capacitor coupling a junction of the aforesaid second and third resistors to the first resistor;

said oscillator circuit further including a pair of output terminals;

the first output terminal coupled by a second capacitor to the junction of the aforesaid second and third resistors;

and the second output terminal coupled by a third capacitor to the opposite side of the collector-emitter circuit of the second transistor.

4. A crystal controlled semiconductor oscillator circuit according to claim 1, wherein said feedback circuit comprises:

a first resistor in the collector-emitter circuit of the first transistor;

a second resistor in the collector-emitter circuit of the second transistor;

a first capacitor coupling the aforesaid resistors;

a semiconductor device;

a second and third capacitor in series connected by a said semiconductor device in parallel with said first capacitor;

a third resistor connected between a junction of said semiconductor device and the second capacitor and the first resistor;

and a fourth resistor connected between a junction of said semiconductor device and the third capacitor and a signal source;

said signal source causing conduction and non-conduction of the semiconductor device thereby varying its impedance and altering the time-constant of said feedback circuit.

5. A crystal controlled semiconductor oscillator circuit according to claim 1, wherein said feedback circuit comprises:
- a first resistor in the collector-emitter circuit of the second transistor;
- a second resistor in series connection with a third transistor in parallel with said first resistor;
- and a third resistor connected between an input to the third transistor and a signal source;
- said signal source causing conduction and non-conduction of the third transistor, thereby varying its impedance and altering the time-constant of the feedback circuit.

6. A crystal controlled semiconductor oscillator circuit according to claim 1, wherein said feedback circuit comprises:
- a first resistor in the collector-emitter circuit of the first transistor;
- a second resistor in the collector-emitter circuit of the second transistor;
- a first capacitor coupling the aforesaid resistors;
- a second and third capacitor in series connected by a a diode in parallel with said first capacitor;
- a third resistor connected between a junction of said diode and the second capacitor and the first resistor,
- a fourth resistor connected between a junction of said semiconductor device and the third capacitor and a first signal source;
- a fifth resistor in series connection with a third transistor in parallel with said second resistor;
- and a sixth resistor connected between an input of the third transistor and a second signal source;
- said first and second signal sources utilized to cause conduction and non-conduction of said diode and third transistor respectively, thereby varying the impedance of said diode and transistor, thus altering the time constant of the feedback circuit.

7. A crystal controlled semiconductor oscillator according to claim 1, further including a plurality of additional crystals, and switching circuit means for selecting the crystal which is to be coupled across the input of the first transistor.

References Cited

FOREIGN PATENTS 1,029,885 12/1950 France.

JOHN KOMINSKI, Primary Examiner

U.S. Cl. X.R.

331—159, 161